(12) United States Patent
Hirose

(10) Patent No.: US 7,211,832 B2
(45) Date of Patent: May 1, 2007

(54) LIGHT EMITTING APPARATUS

(75) Inventor: Minoru Hirose, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 109 days.

(21) Appl. No.: 11/032,220

(22) Filed: Jan. 11, 2005

(65) Prior Publication Data

US 2005/0168992 A1    Aug. 4, 2005

(30) Foreign Application Priority Data

Jan. 13, 2004    (JP)    ............................. 2004-006037

(51) Int. Cl.
*H01L 33/00*    (2006.01)
(52) U.S. Cl. .................. 257/98; 257/99; 257/E33.063; 257/E33.068
(58) Field of Classification Search ................... 257/98
See application file for complete search history.

(56) References Cited

U.S. PATENT DOCUMENTS 6,642,550 B1 * 11/2003 Whitworth et al. ........... 257/99
2003/0205712 A1* 11/2003 Bhat et al. ..................... 257/79
2005/0045903 A1* 3/2005 Abe et al. ................... 257/100
2005/0141830 A1* 6/2005 Peret ........................... 385/94

FOREIGN PATENT DOCUMENTS

JP          9-298310        11/1997
JP          09-298310 A  *  11/1997

* cited by examiner

*Primary Examiner*—Tu-Tu Ho
(74) *Attorney, Agent, or Firm*—McGinn IP Law Group, PLLC

(57) ABSTRACT

A light emitting apparatus has: a support; a wiring layer that is formed on the support; and an LED element that is flip-chip mounted on the wiring layer formed on the support. The wiring layer has: a conductive layer that is formed on the support and is electrically connected to an electrode of the LED element; and a reflection layer that is formed on the conductive layer that has a light reflection property to allow a radiated light from the LED element to be reflected thereon. The reflection layer is of a material that generates no intermetallic compound to a material of the conductive layer.

16 Claims, 6 Drawing Sheets

US 7,211,832 B2

LIGHT EMITTING APPARATUS

The present application is based on Japanese patent application No. 2004-006037, the entire contents of which are incorporated herein by reference.

BACKGROUND OF THE INVENTION

1. Field of the Invention

This invention relates to a light emitting apparatus and, particularly, to a flip-chip type light emitting apparatus that allows light radiated in the direction of an electrode-forming surface of LED element to be effectively used.

2. Description of the Related Art

Light emitting apparatuses are conventionally known that have an LED (light emitting diode) element being flip-chip mounted (herein called flip-chip type) and that use mainly light radiated in the direction of a transparent substrate, such as a sapphire, of the LED element.

Further, in order to enhance the light radiation efficiency, a flip-chip type light emitting apparatus (prior art 1) is known that is composed of: a support for mounting an LED element thereon; a conductive wiring layer formed on the support; and a light reflection layer of Al etc. formed on the wiring layer, so that light radiated in the direction of an electrode-forming surface of the LED element can be reflected by the light reflection layer.

On the other hand, Japanese patent application laid-open No. 9-298310 (prior art 2) discloses a flip-chip type light emitting apparatus that is composed of: a support for mounting an LED element thereon; a first electrode mounted on positive and negative electrodes of the LED element; and a second electrode formed on the surface of the support, wherein the second electrode is multilayered with a first layer formed on the support side, an intermediate layer and a second layer formed on the LED element side (FIG. 1 of prior art 2). The first layer is of a metal with good contacting property with the surface of the support, and the second layer is of a metal with good adhesion property with the first electrode. The intermediate layer serves to prevent the intermetallization between the first layer and the second layer.

However, in prior art 1, since the reflection layer is formed on the wiring layer, there may be generated an intermetallic compound between the reflection layer and the wiring layer. Due to the intermetallic compound, in etching process for making a wiring pattern (electrode pattern on the support), the etching rate will be reduced and thereby a residue will be generated between the wiring patterns. Such a residue causes deterioration in reliability such as short-circuiting. Further, due to the intermetallic compound, since a contact resistance between the reflection layer and a bump material to bond the LED element to the reflection layer increases, the emission efficiency of LED element will be reduced.

Although prior art 2 discloses the multilayered wiring layer structure to prevent the intermetallization, it is not directed to the use of a light reflection layer to enhance the light radiation efficiency.

SUMMARY OF THE INVENTION

It is an object of the invention to provide a light emitting apparatus that can have good emission efficiency and light radiation efficiency.

(1) According to one aspect the invention, a light emitting apparatus comprises:

a support;
a wiring layer that is formed on the support; and
an LED element that is flip-chip mounted on the wiring layer formed on the support,
wherein the wiring layer comprises: a conductive layer that is formed on the support and is electrically connected to an electrode of the LED element; and a reflection layer that is formed on the conductive layer that has a light reflection property to allow a radiated light from the LED element to be reflected thereon, and
the reflection layer is of a material that generates no intermetallic compound to a material of the conductive layer.

(i) The reflection layer may be partially removed in accordance with the electrode of the LED element to expose a surface of the conductive layer, and thereby the conductive layer can be electrically connected through a bump material to the electrode of the LED element at the exposed surface.

(ii) The conductive layer may be of Au, and the reflection layer may be of Cr or Ag alloys.

(iii) The conductive layer may comprise multiple layers which each are of Au, Pt and Ti, the multiple layers being formed in this order on the support, and the reflection layer may be of Cr or Ag alloys.

(2) According to another aspect the invention, a light emitting apparatus comprises:

a support;
an LED element that is flip-chip mounted on the support; and
a wiring layer that is formed on the support,
wherein the wiring layer comprises: a conductive layer that is formed on the support and is electrically connected to an electrode of the LED element; a reflection layer that is formed on the conductive layer that has a light reflection property to allow a radiated light from the LED element to be reflected thereon; and a barrier metal layer that is formed between the conductive layer and the reflection layer and is of a material that prevents the generation of an intermetallic compound between the conductive layer and the reflection layer.

(i) The reflection layer and the barrier layer may be partially removed in accordance with the electrode of the LED element to expose a surface of the conductive layer, and thereby the conductive layer can be electrically connected through a bump material to the electrode of the LED element at the exposed surface.

(ii) The reflection layer may be of Al, and the barrier metal layer may be of one or more of $Cr_2O_3$, Cr, Ti and TiN.

(iii) The conductive layer may comprise multiple layers which each are of Au, Pt and Ti, the multiple layers being formed in this order on the support.

(3) According to another aspect the invention, a light emitting apparatus comprises:

a support;
an LED element that is flip-chip mounted on the support; and
a wiring layer that is formed on the support,
wherein the wiring layer comprises: a conductive layer that is formed on the support and is electrically connected to an electrode of the LED element; and a reflection layer that is formed on the conductive layer that has a light reflection property to allow a radiated light from the LED element to be reflected thereon;
the conductive layer comprises a barrier metal layer that prevents an aggregation in a material of the reflection layer.

(i) The reflection layer may be partially removed in accordance with the electrode of the LED element to expose a surface of the conductive layer, and thereby the conductive layer can be electrically connected through a bump material to the electrode of the LED element at the exposed surface.

(ii) The reflection layer may be of Ag alloys, and the barrier metal layer may be of one or more of $Cr_2O_3$, Cr, Ti and TiN.

(4) According to another aspect the invention, a light emitting apparatus comprises:

a support;

an LED element that is flip-chip mounted on the support; and a wiring layer that is formed on the support, wherein the wiring layer comprises: a conductive layer that is formed on the support and is electrically connected to an electrode of the LED element; and a reflection layer that is formed on the conductive layer that has a light reflection property to allow a radiated light from the LED element to be reflected thereon;

wherein the reflection layer is partially removed in accordance with the electrode of the LED element to expose a surface of the conductive layer, and the conductive layer is electrically connected through a bump material to the electrode of the LED element at the exposed surface.

<Advantages of the Invention>

In the light emitting apparatus of the invention, since the reflection layer is of a material that generates no intermetallic compound to a material of the conductive layer, no intermetallization is generated between the conductive layer and the reflection layer. Therefore, the light radiation efficiency and emission efficiency can be enhanced together.

Alternatively, since a barrier metal layer is formed between the conductive layer and the reflection layer and is of a material that prevents the generation of an intermetallic compound between the conductive layer and the reflection layer, the same effects can be obtained.

Alternatively, since the conductive layer comprises a barrier metal layer that prevents an aggregation in a material of the reflection layer, aggregation in the reflection layer material Ag alloy caused by a change in surrounding temperature or by the turning-on of LED element can be prevented, and therefore the stable bonding force to the support material can be obtained.

Alternatively, since the reflection layer is partially removed in accordance with the electrode of the LED element to expose a surface of the conductive layer, and the conductive layer is electrically connected through a bump material to the electrode of the LED element at the exposed surface, the bump material can be securely placed in the removed portion (indented portion) without flowing laterally due to temperature rise during the bump bonding process. Therefore, the short-cutting between wiring patterns (electrode patterns on the support) can be prevented.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
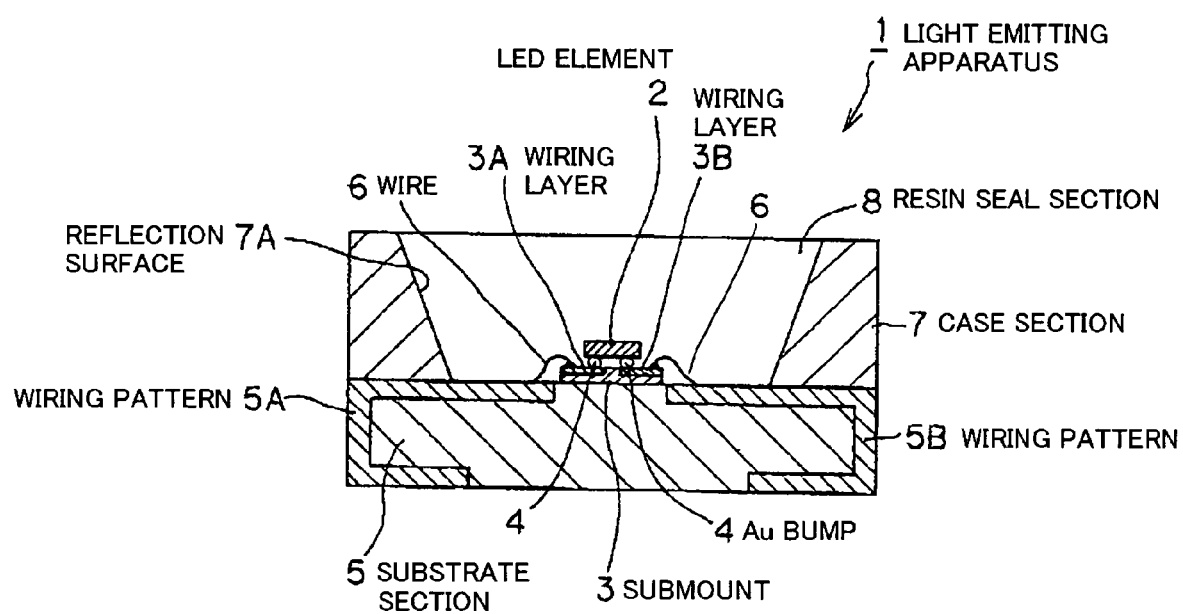
FIG. 1 is a cross sectional view showing a surface mount device type light emitting apparatus in a first preferred embodiment of the invention.

FIG. 1 is a cross sectional view showing a surface mount device type light emitting apparatus in the first preferred embodiment of the invention.

The light emitting apparatus 1 is composed of: a flip-chip type LED element 2 of GaN based semiconductor compound; a submount 3 on which the LED element 2 is mounted; Au bumps 4 as stud bumps that allow the electrical connection between electrodes of the LED element 2 and wiring layers 3A, 3B of the submount 3; a substrate section 5 with wiring patterns 5A, 5b that allow the electrical connection of the LED element 2 with an external circuit (not shown); wires 6 that allow the electrical connection between the wiring layers 3A, 3B of the submount 3 and the wiring patterns 5A, 5b; a case section 7 that has a reflection surface 7A formed inclined to externally radiate light and is of a resin material such as acrylic resin; and a resin seal section 8 that seals the LED element 2 and submount 3 with a resin material filled in its LED element receiving portion of the case section 7.

The LED element 2 is composed of an n-type layer, multiple layers including a light-emitting layer (=active layer) and a p-type layer that are grown on a sapphire substrate by MOCVD (metalorganic chemical vapor deposition). It allows the radiation of blue light with an emission wavelength of 450 to 480 nm mainly from the sapphire substrate side.

The submount 3 is of aluminum nitride (AlN) with excellent heat conductivity. The wiring layers 3A, 3B have on its surface a material layer with a light reflectivity so as to reflect light being radiated from the LED element 2.

The substrate section 5 is of a glass epoxy material and has the wiring patterns 5A, 5b of copper foil formed covering its periphery. The wiring patterns 5A, 5b are formed from the upper face through the side face to the bottom face of substrate section 5, and are ready to be surface-mounted on the external circuit (not shown) by solder bonding etc.

The case section 7 is adhesively bonded onto the substrate section 5 and has the LED element 2, submount 3 and resin seal section 8 within its concave portion with the reflection surface 7A formed on its inner surface. The reflection surface 7A has an aluminum film as a light reflection film formed on the surface by sputtering.

The resin seal section 8 is of epoxy resin with excellent light transmitting property and easy molding property.

Figure 2:
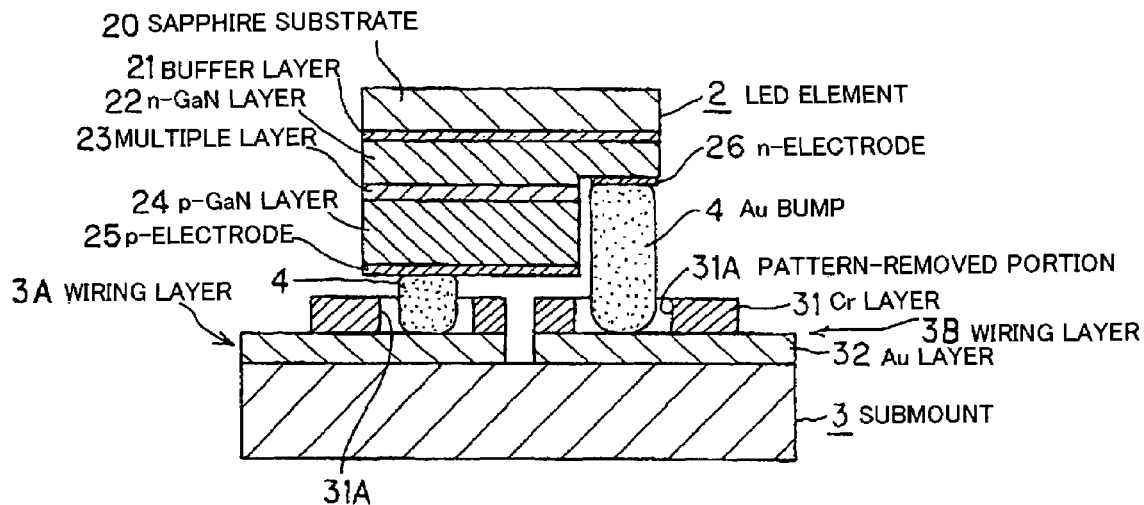
FIG. 2 is an enlarged vertical cross sectional view showing an LED element 2 and a submount 3 in the first embodiment.

FIG. 2 is an enlarged vertical cross sectional view showing the LED element 2 and submount 3 in FIG. 1.

The LED element 2 is composed of a buffer layer 21, an n-type GaN layer 22, multiple layers 23 including the light-emitting layer and a p-type GaN layer 24 that are grown on the sapphire substrate 20. Further, it has a p-electrode 25 formed on the p-type GaN layer 24 and an n-electrode 26 formed on exposed part of the n-type GaN layer 22.

The wiring layers 3A, 3B formed on the submount 3 are composed of an Au layer 32 formed as a conductive layer on the submount 3 and a Cr layer 31 formed as a light reflection layer on the Au layer 32. The Cr layer 31 is provided with a pattern-removed portion 31A that allows the bonding of Au bumps 4 to the Au layer 32.

Figure 3:
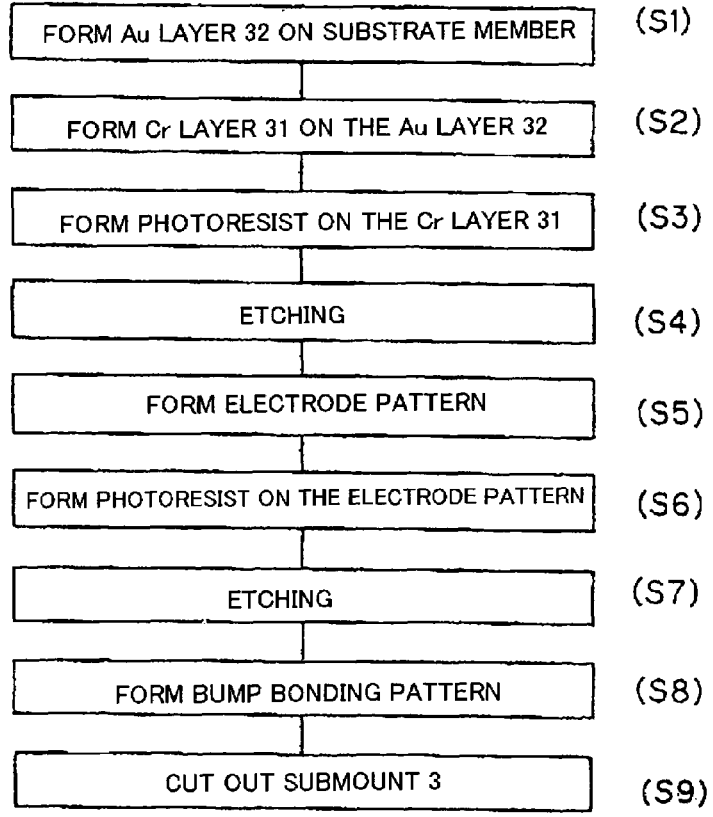
FIG. 3 is a flowchart showing a process of fabricating the submount 3 of the first embodiment.

The process of fabricating the submount 3 of the first embodiment will be explained below referring to FIGS. 1, 2 and 3. FIG. 3 is a flowchart showing the process of fabricating the submount 3.

First, the Au layer 32 as the conductive layer is formed on the surface of the AlN substrate material by deposition (S1). Then, the Cr layer 31 is formed on the Au layer 32 by magnetron sputtering using a Cr target with Ar gas of $10^{-7}$ Torr (S2). Then, a photoresist is formed according to an electrode pattern on the Cr layer 31 (S3). Then, the Cr layer 31 is etched by a solution of cerium diammonium nitrate and perchloric acid and the Au layer 32 is further etched by nitrohydrochloric acid (S4). The electrode pattern is formed by the etching (S5). Then, a photoresist is formed according to the bonding pattern of Au bumps 4 on the Cr layer 31 (S6). Then, the Cr layer 31 is etched by the solution of cerium diammonium nitrate and perchloric acid (S7). By this etching, the pattern-removed portion 31A is, as a bump bonding pattern, formed according to the bonding pattern of Au bumps 4 (S8). Then, the resist on the Cr layer 31 is removed and the Au bumps 4 are disposed at the pattern-removed portion 31A. Then, the substrate material is, as the submount 3, cut out by dicing with a dicer (S9).

On the submount 3 fabricated by the above process, the LED element 2 is mounted by ultrasonic bonding while positioning the p-electrode 25 and n-electrode 26 of the LED element 2 to the Au bumps 4.

The submount 3 with the LED element 2 bonded thereto is bonded to the bottom of case section 7, i.e., onto the surface of substrate section 5 where the wiring patterns 5A, 5b are exposed. The wiring layers 3A, 3B of submount 3 are electrically connected through the wires 6 to the wiring patterns 5A, 5b of substrate section 5. Finally, epoxy resin is filled inside the case section 7 including the reflection surface 7A to make the resin seal section 8 to seal its inclusion integrally.

The operation of the light emitting apparatus 1 of the first embodiment will be explained below.

The wiring patterns 5A, 5b of light emitting apparatus 1 are connected to a power supply device (not shown) and electric power is supplied therethrough. Thereby, the light-emitting layer in the multilayer 23 of LED element 2 emits light, and the emitted light is externally radiated mainly from the sapphire substrate located over the light-emitting layer. Light radiated from the sapphire substrate side is externally radiated through the resin seal section 8 from the case section 7. The reflection surface 7A of case section 7 reflects part of light radiated from the LED element 2 to be externally radiated from the case section 7. On the other hand, light radiated in the direction of submount 3 from the LED element 2 is reflected by the Cr layer 31 on the wiring layers 3A, 3B and is externally radiated through the resin seal section 8 from the case section 7.

Effects obtained by the first embodiment are as follows.

(1) Since the wiring layers 3A, 3B are on its surface provided with the Cr layer 31, as a light reflection layer, that generates no intermetallic compound (alloy) to the Au layer 32, generation of residue caused by a reduction in etching rate can be prevented while securing the light reflectivity by the Cr layer 31. Therefore, the light emitting apparatus 1 can have excellent reliability and light reflection efficiency while preventing the short-circuiting between the electrode patterns (wiring layers 3A, 3B).

(2) Since the light reflection layer (Cr layer 31) and the Au layer 32 are not subjected to intermetallization, no intermetallic compound is generated in the bump bonding region between the LED element 2 and the submount 3. Thereby, a reduction in contact resistance due to the generation of intermetallic compound can be prevented. Therefore, the light emitting apparatus 1 have excellent emission efficiency.

The inventor makes a comparative example for comparison with the LED element 2 and submount 3 of this embodiment. The comparison example is prepared such that an Au layer as a conductive layer is formed on an AlN substrate material by deposition, an Al layer as a light reflection layer is formed on the surface of Au layer by deposition, and then an electrode pattern is made using a photoresist. Then, the Al layer is etched by a solution of sodium hydroxide. In this case, it is found that a residue of Al—Au intermetallic compound is partially generated. Further, when a photoresist is formed according to the bonding pattern of Au bumps 4 on the Al layer and the Al layer is etched by the solution of sodium hydroxide, the residue of Al—Au intermetallic compound is left in the pattern-removed portion 31A formed by the etching. In this situation, the Au bumps 4 are disposed and the p-electrode 25 and n-electrode 26 of LED element 2 are ultrasonic-bonded therethrough. However, a sufficient brightness cannot be obtained due to an increase in contact resistance.

Although in the first embodiment the Au layer 32 is used as the conductive layer, another conductive layer may be a multiplayer of Au/Pt/Ti that three layers are sequentially formed in the order of Au, Pt and Ti on the submount 3.

Although in the first embodiment the submount 3 is separately made by cutting out the substrate material composed of the conductive layer and the wiring layer as the light reflection layer, the other way may be employed. For example, the substrate material with the LED elements 2 bonded thereon through the Au bumps 4 may be cut out into unit devices (with submount) by dicing.

The process of making the LED element 2 is not limited to MOCVD and may be another process that allows the epitaxial growth of GaN. For example, it may be made by MBE (molecular beam epitaxy) or HVPE (hydride vapor phase epitaxy).

Figure 4:
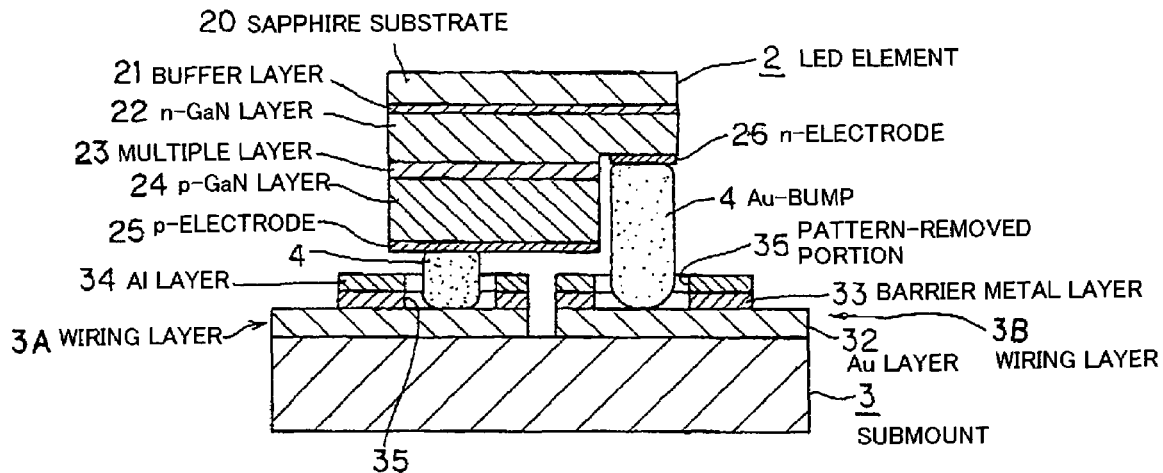
FIG. 4 is an enlarged vertical cross sectional view showing an LED element 2 and a submount 3 in a light emitting apparatus in a second preferred embodiment of the invention.

FIG. 4 is an enlarged vertical cross sectional view showing the LED element 2 and submount 3 in a light emitting apparatus in the second preferred embodiment of the invention.

The light emitting apparatus 1 of the second embodiment is different from that of the first embodiment in that the wiring layers 3A, 3B are composed of the Au layer 32, a barrier metal layer 33 of chromium oxide ($Cr_2O_3$) and the Al layer 34, and the Al layer 34 on the top surface serves as a light reflection layer. In the second embodiment, like components are indicated by the same numerals used in the first embodiment.

Figure 5:
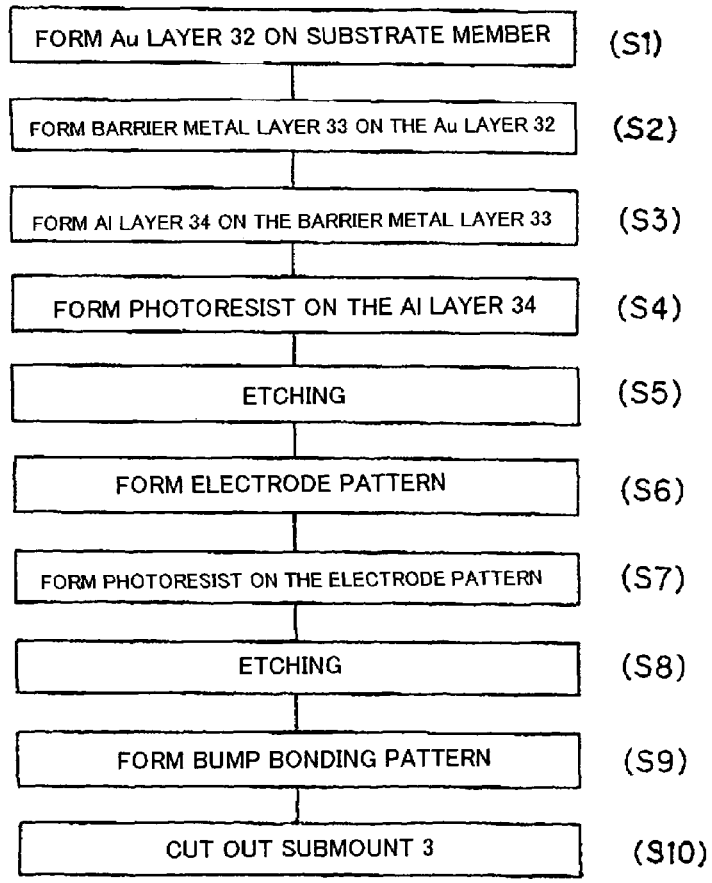
FIG. 5 is a flowchart showing a process of fabricating the submount 3 of the second embodiment.

The process of fabricating the submount 3 of the second embodiment will be explained below referring to FIGS. 4 and 5. FIG. 5 is a flowchart showing the process of fabricating the submount 3.

First, the Au layer 32 as the conductive layer is formed on the surface of the AlN substrate material by deposition (S1). Then, the barrier metal layer 33 of chromium oxide is formed on the Au layer 32 by magnetron sputtering using a Cr target with $Ar/N_2/O_2$ mixed gas of $10^{-7}$ Torr (S2). Then, the Al layer 34 is formed on the barrier metal layer 33 by deposition (S3). Then, a photoresist is formed according to an electrode pattern on the Al layer 34 (S4). Then, the Al layer 34 is etched by a solution of sodium hydroxide, the barrier metal layer 33 is etched by cerium diammonium nitrate and perchloric acid, and the Au layer 32 is etched by nitrohydrochloric acid (S5). The electrode pattern is formed by the etching (S6). Then, a photoresist is formed according to the bonding pattern of Au bumps 4 on the Al layer 34 (S7). Then, the Al layer 34 is etched by the solution of sodium hydroxide, and the barrier metal layer 33 is etched by cerium diammonium nitrate and perchloric acid (S8). By this etching, a pattern-removed portion 35 is, as a bump bonding pattern, formed according to the bonding pattern of Au bumps 4 (S9). Then, the resist on the Al layer 34 is removed and the Au bumps 4 are disposed at the pattern-removed portion 35. Then, the substrate material is, as the submount 3, cut out by dicing with a dicer (S10).

Effects obtained by the second embodiment are, in addition to those obtained by the first embodiment, as follows.

(1) Since the Au layer 32 and the Al layer 34 are formed through the barrier metal layer 33 on the wiring layers 3A, 3B, reflected light can be effectively used based on the reflectivity of barrier metal layer 33.

(2) Since the Au layer 32 and the Al layer 34 do not contact each other due to the intervening barrier metal layer 33, generation of intermetallic compound due to the contact of Au and Al can be avoided. As a result, generation of residue and increase in contact resistance can be prevented and thereby the reliability can be enhanced. A desired metallic material can be chosen according to necessary light reflectivity.

Although in the second embodiment the barrier metal layer 33 is of chromium oxide, it may be a single layer of chromium (Cr), titanium (Ti), titanium nitride (TiN) etc. or a multilayer thereof. The same effects can be obtained thereby.

Although in the second embodiment the Au layer 32 is used as the conductive layer, another conductive layer may be a multiplayer of Au/Pt/Ti that three layers are sequentially formed starting from Au on the submount 3.

The Al layer 34 as the light reflection layer can be replaced by a light reflection layer of the other material that generates no intermetallic compound to the Au layer 32. For example, the light reflection layer may be of Ag alloy etc. with oxidation resistance.

Figure 6:
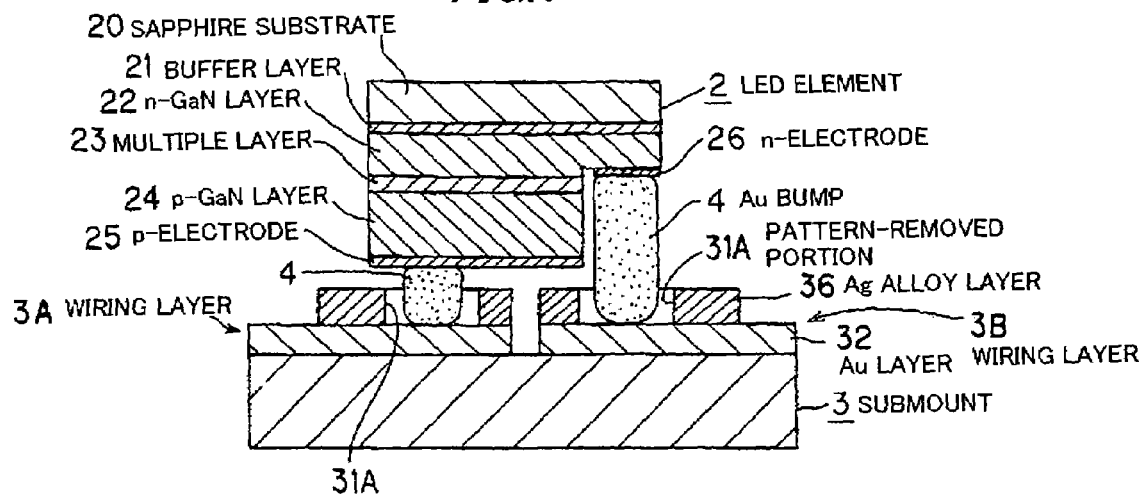
FIG. 6 is an enlarged vertical cross sectional view showing an LED element 2 and a submount 3 in a light emitting apparatus in a third preferred embodiment of the invention.

FIG. 6 is an enlarged vertical cross sectional view showing the LED element 2 and submount 3 in a light emitting apparatus in the third preferred embodiment of the invention.

The light emitting apparatus 1 of the third embodiment is different from that of the first embodiment in that the wiring layers 3A, 3B are composed of the Au layer 32, and an Ag alloy layer 36 with oxidation resistance, and the Ag alloy layer 36 on the top surface serves as a light reflection layer. In the third embodiment, like components are indicated by the same numerals used in the first embodiment.

Figure 7:
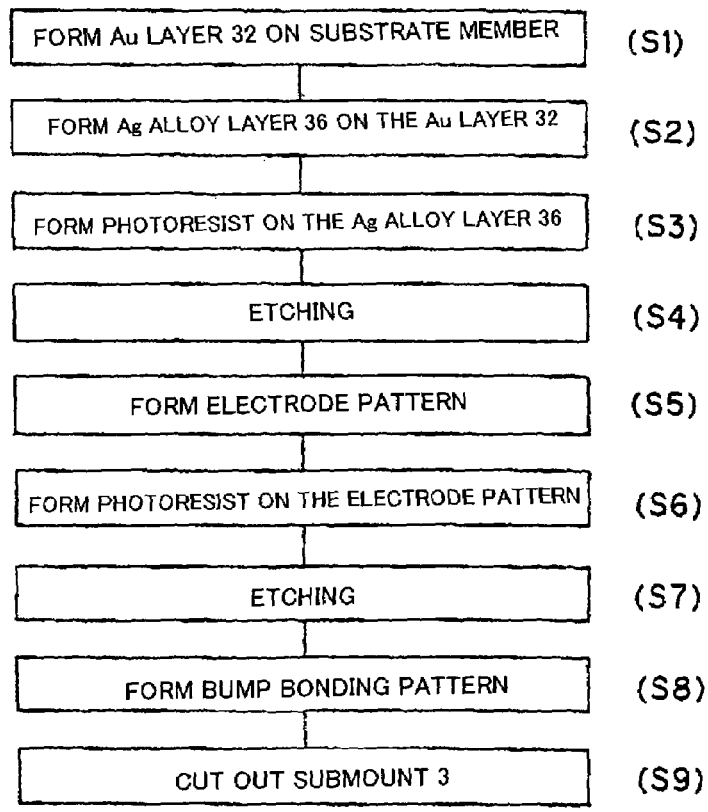
FIG. 7 is a flowchart showing a process of fabricating the submount 3 of the third embodiment.

The process of fabricating the submount 3 of the third embodiment will be explained below referring to FIGS. 6 and 7. FIG. 7 is a flowchart showing the process of fabricating the submount 3.

First, the Au layer 32 as the conductive layer is formed on the surface of the AlN substrate material by deposition (S1). Then, the Ag alloy layer 36 is formed on the Au layer 32 by magnetron sputtering using an Ag alloy target with Ar gas of $10^{-7}$ Torr (S2). Then, a photoresist is formed according to an electrode pattern on the Ag alloy layer 36 (S3). Then, the Ag alloy layer 36 is etched by a solution of chromic anhydride, perchloric acid and concentrated sulfuric acid and the Au layer 32 is further etched by nitrohydrochloric acid (S4). The electrode pattern is formed by the etching (S5). Then, a photoresist is formed according to the bonding pattern of Au bumps 4 on the Ag alloy layer 36 (S6). Then, the Ag alloy layer 36 is etched by the solution of chromic anhydride, perchloric acid and concentrated sulfuric acid (S7). By this etching, the pattern-removed portion 31A is, as a bump bonding pattern, formed according to the bonding pattern of Au bumps 4 (S8). Then, the resist on the Ag alloy layer 36 is removed and the Au bumps 4 are disposed at the pattern-removed portion 31A. Then, the substrate material is, as the submount 3, cut out by dicing with a dicer (S9).

On the submount 3 fabricated by the above process, the LED element 2 is mounted by ultrasonic bonding while positioning the p-electrode 25 and n-electrode 26 of the LED element 2 to the Au bumps 4.

The submount 3 with the LED element 2 bonded thereto is bonded to the bottom of case section 7, i.e., onto the surface of substrate section 5 where the wiring patterns 5A, 5b are exposed. The wiring layers 3A, 3B of submount 3 are electrically connected through the wires 6 to the wiring patterns 5A, 5b of substrate section 5. Finally, epoxy resin is filled inside the case section 7 including the reflection surface 7A to make the resin seal section 8 to seal its inclusion integrally. When the light emitting apparatus 1 thus fabricated is turned on, good brightness is obtained.

Effects obtained by the third embodiment are as follows.

(1) Since the wiring layers 3A, 3B are on its surface provided with the Ag alloy layer 36 that has excellent oxidation resistance and high light reflectivity, generation of residue caused by a reduction in etching rate can be prevented while securing the light reflectivity by the Ag alloy layer 36. Therefore, the light emitting apparatus 1 can have excellent long-term reliability and light reflection efficiency while preventing the short-circuiting between the electrode patterns (wiring layers 3A, 3B).

(2) Since the light reflection layer (Ag alloy layer 36) and the Au layer 32 are not subjected to intermetallization, no intermetallic compound is generated in the bump bonding region between the LED element 2 and the submount 3. Thereby, a reduction in contact resistance due to the generation of intermetallic compound can be prevented. Therefore, the light emitting apparatus 1 have excellent emission efficiency.

Optionally, a barrier metal layer may be formed between the Au layer 32 and the Ag alloy layer 36. The barrier metal layer can be a single layer of Ni, Pt, W etc., in addition to Cr, Ti and TiN exemplified in the second embodiment, or a multilayer thereof. The same effects can be obtained thereby.

Figure 8:
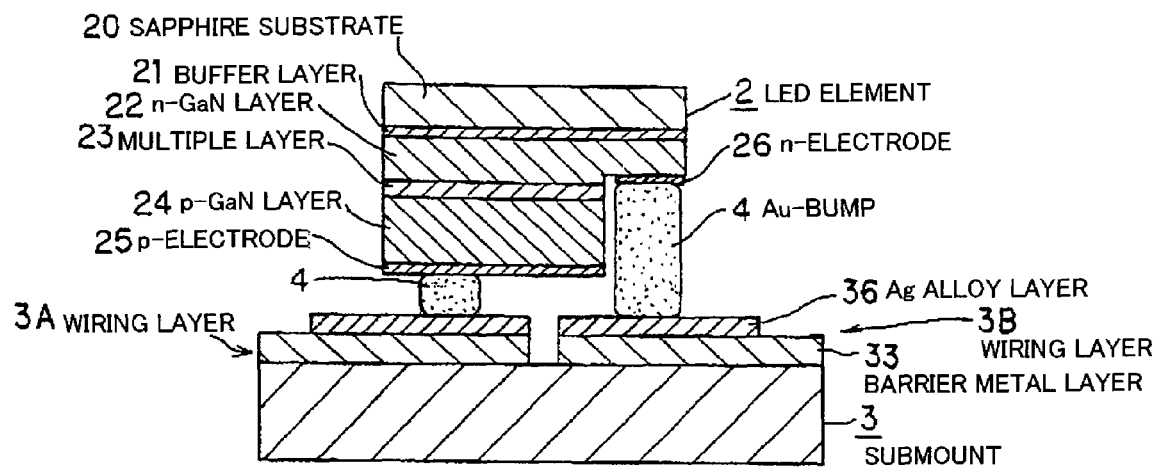
FIG. 8 is an enlarged vertical cross sectional view showing an LED element 2 and a submount 3 in a light emitting apparatus in a fourth preferred embodiment of the invention.

FIG. 8 is an enlarged vertical cross sectional view showing the LED element 2 and submount 3 in a light emitting apparatus in the fourth preferred embodiment of the invention.

The light emitting apparatus 1 of the fourth embodiment is different from that of the first embodiment in that the wiring layers 3A, 3B are composed of the barrier metal layer 33 of Ti, and the Ag alloy layer 36, and the Ag alloy layer 36 on the top surface serves as a light reflection layer. In the fourth embodiment, like components are indicated by the same numerals used in the first embodiment.

Figure 9:
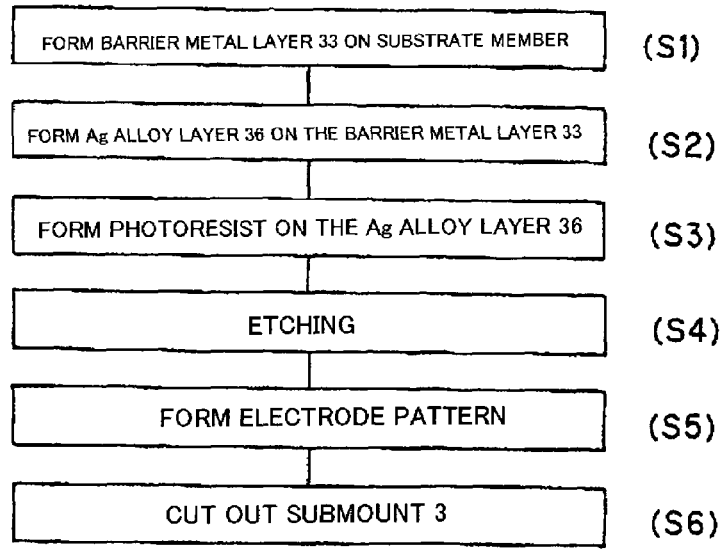
FIG. 9 is a flowchart showing a process of fabricating the submount 3 of the fourth embodiment.

The process of fabricating the submount 3 of the fourth embodiment will be explained below referring to FIGS. 8 and 9. FIG. 9 is a flowchart showing the process of fabricating the submount 3.

First, the Ti barrier metal layer 33 as the conductive layer is formed on the surface of the AlN substrate material by deposition (S1). Then, the Ag alloy layer 36 is formed on the barrier metal layer 33 by magnetron sputtering using an Ag alloy target with Ar gas of $10^{-7}$ Torr (S2). Then, a photoresist is formed according to an electrode pattern on the Ag alloy layer 36 (S3). Then, the Ag alloy layer 36 and barrier metal layer 33 are etched by a solution of chromic anhydride, perchloric acid and concentrated sulfuric acid (S4). The electrode pattern is formed by the etching (S5). Then, the resist on the Ag alloy layer 36 is removed and the Au bumps 4 are disposed at a predetermined position on the Ag alloy layer 36. Then, the substrate material is, as the submount 3, cut out by dicing with a dicer (S6).

In the fourth embodiment, the Ag alloy layer 36 can have good bonding property by virtue of the construction that the barrier metal layer 33 is formed on the surface of substrate material and the Ag alloy layer 36 is formed thereon. Thus, aggregation in Ag alloy caused by a change in surrounding temperature or by the turning-on of LED element 2 can be prevented, and the stable bonding force to the substrate material can be obtained. Therefore, the light emitting apparatus 1 can have high reliability.

Although in the fourth embodiment the barrier metal layer 33 is of only Ti, it may be a single layer of Ti, TiN, Ni, Pt, W etc. or a multiplayer thereof. The same effects can be obtained thereby.

Figure 10:
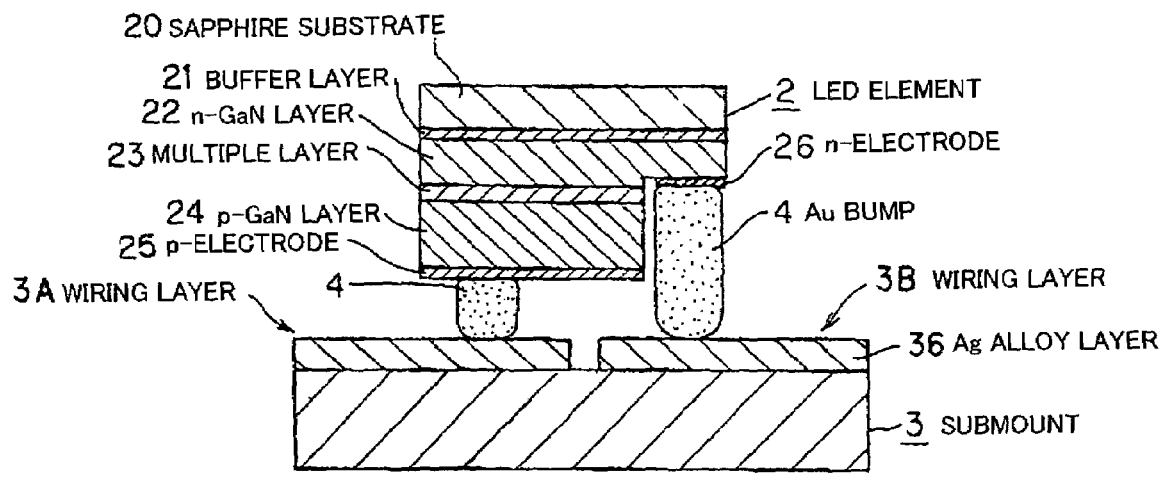
FIG. 10 is an enlarged vertical cross sectional view showing an LED element 2 and a submount 3 in a light emitting apparatus in a fifth preferred embodiment of the invention.

FIG. 10 is an enlarged vertical cross sectional view showing the LED element 2 and submount 3 in a light emitting apparatus in the fifth preferred embodiment of the invention.

The light emitting apparatus 1 of the fifth embodiment is different from that of the first embodiment in that the wiring layers 3A, 3B are composed of the Ag alloy layer 36, and the Ag alloy layer 36 on the top surface serves as a light reflection layer. In the fifth embodiment, like components are indicated by the same numerals used in the first embodiment.

Figure 11:
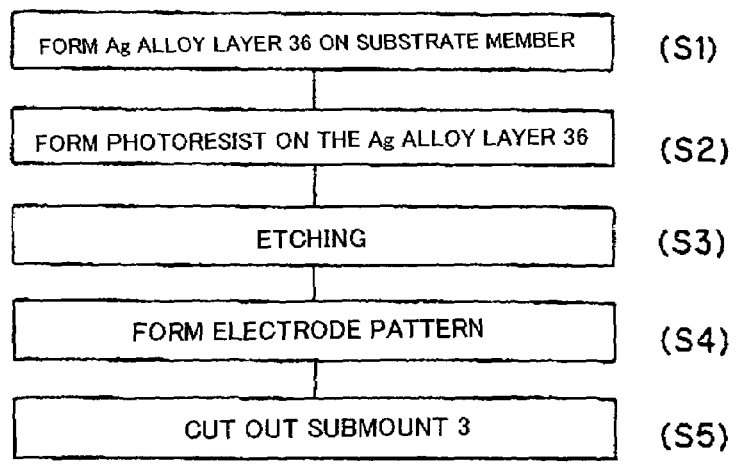
FIG. 11 is a flowchart showing a process of fabricating the submount 3 of the fifth embodiment.

The process of fabricating the submount 3 of the fifth embodiment will be explained below referring to FIGS. 10 and 11. FIG. 11 is a flowchart showing the process of fabricating the submount 3.

First, the Ag alloy layer 36 as the conductive layer is formed on the surface of the AlN substrate material by magnetron sputtering using an Ag alloy target with Ar gas of $10^{-7}$ Torr (S1). Then, a photoresist is formed according to an electrode pattern on the Ag alloy layer 36 (S2). Then, the Ag alloy layer 36 is etched by a solution of chromic anhydride, perchloric acid and concentrated sulfuric acid (S3). The electrode pattern is formed by the etching (S4). Then, the resist on the Ag alloy layer 36 is removed and the Au bumps 4 are disposed at a predetermined position on the Ag alloy layer 36. Then, the substrate material is, as the submount 3, cut out by dicing with a dicer (S5).

In the fifth embodiment, the wiring layers 3A, 3B can have oxidation resistance and light reflection property since they are composed of the Ag alloy layer 36. Further, since the wiring layers 3A, 3B serve as the conductive layer and the light reflection layer, the film formation process can be omitted. Therefore, the fabrication process of submount can be simplified and the manufacturing cost thereof can be reduced.

In the abovementioned embodiments, the submount 3 may be of $Al_2O_3$ other than AlN.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting apparatus, comprising:
   a support;
   a wiring layer that is formed on the support; and
   a light emitting diode (LED) element that is flip-chip mounted on the wiring layer formed on the support,
   wherein the wiring layer comprises:
   a conductive layer that is formed on the support and is electrically connected to an electrode of the LED element;
   a light reflection layer, formed on a surface of the conductive layer, that has a light reflection property to allow a radiated light from the LED element to be reflected thereon, and the light reflection layer comprises a material that generates no intermetallic compound to a material of the conductive layer,
   wherein the light reflection layer is partially removed in accordance with the electrode of the LED element to expose a surface of the conductive layer.

2. The light emitting apparatus according to claim 1, wherein:
   the conductive layer is electrically connected through a bump material to the electrode of the LED element at the exposed surface.

3. The light emitting apparatus according to claim 1, wherein:
   the conductive layer comprises Au, and
   the light reflection layer comprises Cr or Ag alloys.

4. The light emitting apparatus according to claim 1, wherein:
   the conductive layer comprises multiple layers which comprise Au, Pt and Ti, the multiple layers being formed in this order on the support, and
   the light reflection layer comprises Cr or Ag alloys.

5. A light emitting apparatus, comprising:
   a support;
   a light emitting diode (LED) element that is flip-chip mounted on the support; and
   a wiring layer that is formed on the support,
   wherein the wiring layer comprises:
   a conductive layer that is formed on the support and is electrically connected to an electrode of the LED element;
   a reflection layer that is formed on the conductive layer that has a light reflection property to allow a radiated light from the LED element to be reflected thereon; and
   a barrier metal layer that is formed between the conductive layer and the reflection layer and is of a material that prevents the generation of an intermetallic compound between the conductive layer and the reflection layer,
wherein the reflection layer and the barrier layer are partially removed in accordance with the electrode of the LED element to expose a surface of the conductive layer, and
the conductive layer is electrically connected through a bump material to the electrode of the LED element at the exposed surface.

6. The light emitting apparatus according to claim 5, wherein:
the reflection layer comprises Al, and
the barrier metal layer comprises one or more of $Cr_2O_3$, Cr, Ti and TiN.

7. The light emitting apparatus according to claim 6, wherein:
the conductive layer comprises multiple layers which comprise Au, Pt and Ti, the multiple layers being formed in this order on the support.

8. A light emitting apparatus, comprising:
a support;
a light emitting diode (LED) element that is flip-chip mounted on the support; and
a wiring layer that is formed on the support,
wherein the wiring layer comprises:
  a conductive layer that is formed on the support and is electrically connected to an electrode of the LED element; and
  a light reflection layer, formed on a surface of the conductive layer, that has a light reflection property to allow a radiated light from the LED element to be reflected thereon,
  wherein the conductive layer comprises a barrier metal that prevents an aggregation in a material of the light reflection layer, and
  the light reflection layer is partially removed in accordance with the electrode of the LED element to expose a surface of the conductive layer.

9. The light emitting apparatus according to claim 8, wherein:
the conductive layer is electrically connected through a bump material to the electrode of the LED element at the exposed surface.

10. The light emitting apparatus according to claim 8, wherein:
the light reflection layer comprises Ag alloys, and
the barrier metal comprises one or more of $Cr_2O_3$, Cr, Ti and TiN.

11. A light emitting apparatus, comprising:
a support;
a light emitting diode (LED) element that is flip-chip mounted on the support; and
a wiring layer that is formed on the support,
wherein the wiring layer comprises:
  a conductive layer that is formed on the support and is electrically connected to an electrode of the LED element; and
  a reflection layer that is formed on the conductive layer that has a light reflection property to allow a radiated light from the LED element to be reflected thereon,
wherein the reflection layer is partially removed in accordance with the electrode of the LED element to expose a surface of the conductive layer, and the conductive layer is electrically connected through a bump material to the electrode of the LED element at the exposed surface.

12. A light emitting apparatus, comprising:
a support;
a wiring layer that is formed on the support; and
a light emitting diode (LED) element that is flip-chip mounted on the wiring layer formed on the support,
wherein the wiring layer comprises:
  a conductive layer that is formed on the support and is electrically connected to an electrode of the LED element; and
  a reflection layer that is formed on the conductive layer that has a light reflection property to allow a radiated light from the LED element to be reflected thereon, and
  the reflection layer is of a material that generates no intermetallic compound to a material of the conductive layer, wherein:
  the reflection layer is partially removed in accordance with the electrode of the LED element to expose a surface of the conductive layer, and
  the conductive layer is electrically connected through a bump material to the electrode of the LED element at the exposed surface.

13. The light emitting apparatus according to claim 12, wherein:
the conductive layer comprises Au, and
the reflection layer comprises Cr or Ag alloys.

14. The light emitting apparatus according to claim 12, wherein:
the conductive layer comprises multiple layers which comprise Au, Pt and Ti, the multiple layers being formed in this order on the support, and
the reflection layer is of Cr or Ag alloys.

15. A light emitting apparatus, comprising:
a support;
a light emitting diode (LED) element that is flip-chip mounted on the support; and
a wiring layer that is formed on the support,
wherein the wiring layer comprises:
  a conductive layer that is formed on the support and is electrically connected to an electrode of the LED element; and
  a reflection layer that is formed on the conductive layer that has a light reflection property to allow a radiated light from the LED element to be reflected thereon,
  wherein the conductive layer comprises a barrier metal layer that prevents an aggregation in a material of the reflection layer;
  the reflection layer is partially removed in accordance with the electrode of the LED element to expose a surface of the conductive layer, and
  the conductive layer is electrically connected through a bump material to the electrode of the LED element at the exposed surface.

16. The light emitting apparatus according to claim 15, wherein:
the reflection layer comprises Ag alloys, and
the barrier metal layer comprises one or more of $Cr_2O_3$, Cr, Ti and TiN.

* * * * *